United States Patent [19]

Kakumaru et al.

[11] Patent Number: 4,562,142
[45] Date of Patent: Dec. 31, 1985

[54] AQUEOUS ALKALI DEVELOPABLE PHOTOSENSITIVE COMPOSITION AND PHOTOSENSITIVE LAMINATE

[75] Inventors: Hajime Kakumaru; Nobuyuki Hayashi, both of Hitachi, Japan

[73] Assignee: Hitachi Chemical Company, Ltd., Tokyo, Japan

[21] Appl. No.: 655,435

[22] Filed: Sep. 28, 1984

Related U.S. Application Data

[63] Continuation of Ser. No. 442,111, Nov. 16, 1982, abandoned.

[30] Foreign Application Priority Data

Nov. 20, 1981 [JP] Japan .................. 56-187333

[51] Int. Cl.⁴ .............................................. G03C 1/68
[52] U.S. Cl. ................................ 430/288; 430/910; 430/271; 430/281; 430/285; 522/121
[58] Field of Search ............... 430/281, 285, 288, 910, 430/271; 204/159.15

[56] References Cited

U.S. PATENT DOCUMENTS

| | | | |
|---|---|---|---|
| 4,108,666 | 8/1978 | Hayashi et al. | 430/281 |
| 4,245,031 | 1/1981 | Chambers | 430/288 |
| 4,264,708 | 4/1981 | Chambers | 430/288 |
| 4,291,115 | 9/1981 | Chambers | 430/288 |

*Primary Examiner*—Jack P. Brammer
*Attorney, Agent, or Firm*—Antonelli, Terry & Wands

[57] ABSTRACT

Photosensitive composition comprising (a) an addition polymerizable compound of the general formula:

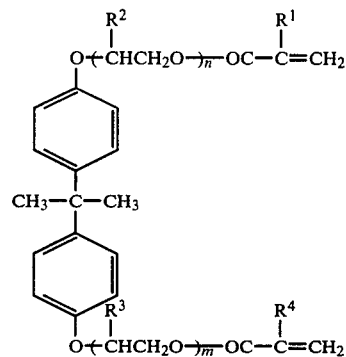

wherein $R^1$, $R^2$, $R^3$ and $R^4$ are hydrogen atom or methyl group, and $n+m=8$ to 12, (b) an addition-poymerizable compound of the general formula:

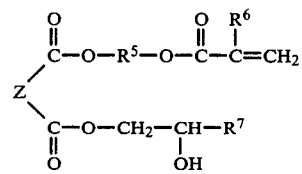

wherein Z is a cyclic dibasic acid residue, $R^5$ is a $C_1$ to $C_3$ alkylene group, $R^6$ is hydrogen atom or methyl group, and $R^7$ is hydrogen atom, methyl group, ethyl group or $CH_2X$ in which X is chlorine atom or bromine atom, (c) a photoactivatable polymerization initiator, and (d) a linear copolymer having a carboxy content of 17 to 50% by mole, a water absorption of 4 to 30% by weight and a weight average molecular weight of 30,000 to 400,000. Photosensitive laminate having a photosensitive layer formed from the composition has an excellent resistance to plating liquids as well as excellent etching resistance, chemical resistance, adhesion property to boards and developing property.

11 Claims, No Drawings

AQUEOUS ALKALI DEVELOPABLE PHOTOSENSITIVE COMPOSITION AND PHOTOSENSITIVE LAMINATE

This is a continuation of application Ser. No. 442,111, filed Nov. 16, 1982 now abandoned.

BACKGROUND OF THE INVENTION

The present invention relates to a photosensitive composition and a photosensitive laminate, and more particularly to a photosensitive composition and a photosensitive laminate which are developable by an aqueous alkali solution.

A photoresist formed from a photosensitive composition has been employed in the preparation of printed circuit boards. Conventionally, a photoresist image has been produced by coating a liquid photosensitive composition containing a solvent to a board for printed circuit boards, drying the coating to remove the solvent, exposing imagewise the dried coating to an active light and developing the image.

In recent years, in order to improve the workability, air pollution and yield of the above process, there has been proposed and employed availably a flexible three layer laminate, i.e. a photosensitive laminate (hereinafter referred to as "photosensitive element") composed of a film support, a dried layer of a photosensitive composition (hereinafter referred to as "photosensitive layer") and a protective cover film. As a photosensitive composition, there are known the so-called alkali development type that unexposed areas are removed by an aqueous solution of an alkali and the so-called solvent development type that unexposed areas are removed by an organic solvent.

In case of a photosensitive element of the alkali development type, a protective cover film is removed from the element and the photosensitive layer supported on a film support is then adhered under pressure with heating to the surface of a board. The photosensitive layer is then exposed imagewise to light through a negative film, and after peeling off the support film, the unexposed areas are removed with an aqueous alkali solution as a developer to form a photoresist image. Etching or plating treatment of the metal surface of the board is carried out by employing the thus formed resist image as a photomask, and the photoresist image was then removed from the metal surface by employing an aqueous stronger alkaline solution than the developer to provide a printed circuit board or the like.

It is necessary that the photoresist image is sufficiently resistant to the etching or plating treatment of the board. In the etching treatment, a metal (usually copper) of the surface area of the board is removed by employing an aqueous solution of ferric chloride, cupric chloride or ammonium persulfate. Many kinds of the plating liquids are known, and for instance, in case of a photosensitive element of the alkali development type, acidic plating liquids are usually employed. The metal surface in the area not masked with the photoresist image is plated by solder plating or a combination of copper sulfate plating and solder plating. In the plating treatment, an electric current is passed through a highly concentrated solution of a chemical reagent, and accordingly the plating treatment is severer than the etching treatment.

Photosensitive elements of the alkali development type are disclosed, for instance, in Japanese Unexamined Patent Publication (Tokkyo Kokoku) No. 94388/1977, No. 130701/1977, No. 128688/1978 and No. 147323/1975. However, these conventional photosensitive elements of the alkali development type have the disadvantage that the photoresist image obtained therefrom is insufficient in the electroplating resistance. That is to say, though the photoresist image is endurable to the electroplating with a copper sulfate plating liquid and a solder plating liquid having a low concentration of borofluoric acid, it is poor in resistance to a solder plating liquid for common use having a borofluoric acid concentration of more than 350 g./liter, and in the plating with such a solder plating liquid, peeling, blister and deposition of solder in the interface between the resist and the board occur. The concentration of borofluoric acid in the solder plating liquid which is the most commonly used is from 350 to 500 g./liter, and within this range, the plating liquid for obtaining eutectic crystal solder of dense particles can be stably controlled.

It is an object of the present invention to provide a photosensitive composition capable of forming a photosensitive layer of alkali developable photosensitive elements having an excellent plating resistance, good etching resistance, chemical resistance and other properties required for the alkali developable photosensitive elements such as an adhesive property to boards and a developing property.

Another object of the invention is to provide an alkali developable photosensitive element having an excellent plating resistance and moreover having good etching resistance, chemical resistance, adhesive property to boards and developing property.

These and other objects of the present invention will become apparent from the description hereinafter.

SUMMARY OF THE INVENTION

In accordance with the present invention, there is provided a photosensitive composition comprising:

(a) an addition-polymerizable compound of the general formula (I):

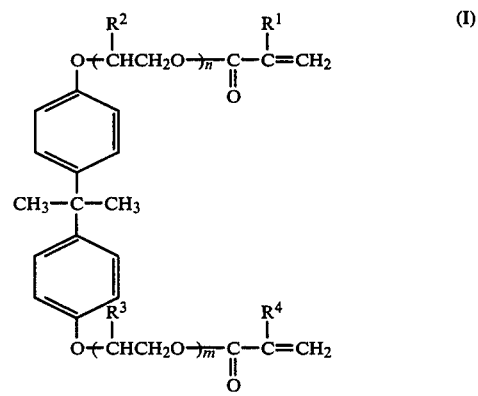

wherein $R^1$, $R^2$, $R^3$ and $R^4$ are the same or different and each is hydrogen atom or methyl group, and n and m are a positive integer, provided that $n+m=8$ to 12, (b) an addition-polymerizable compound of the general formula (II):

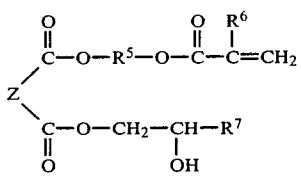

(II)

wherein Z is a cyclic diabasic acid residue, $R^5$ is an alkylene group having 1 to 3 carbon atoms, $R^6$ is hydrogen atom or methyl group, and $R^7$ is hydrogen atom, methyl group, ethyl group or $CH_2X$ in which X is chlorine atom or bromine atom, (c) a photoactivatable polymerization initiator, and (d) a linear copolymer having a carboxy content of 17 to 50% by mole, a water absorption of 4 to 30% by weight and a weight average molecular weight of 30,000 to 400,000.

The photosensitive composition of the present invention is availably employed for forming a photosensitive layer of a photosensitive element. On at least one surface of the photosensitive layer, a polymer film is laminated to give the photosensitive element.

DETAILED DESCRIPTION

Representative examples of the addition-polymerizable compound of the general formula (I) included in the photosensitive composition of the present invention are, for instance, 2,2-bis(4-methacryloyloxypentaethoxyphenyl)propane, 2,2-bis(4-acryloyloxypentaethoxyphenyl)propane, 2,2-bis(4-methacryloyloxytetraethoxyphenyl)propane, and the like. Commercially available compounds (I) are, for instance, BPE-10 (commercial name of product of Shin Nakamura Kagaku Kogyo Kabushiki Kaisha). The addition-polymerizable compounds (I) may be employed alone or in admixture thereof. When the sum of n and m in the general formula (I) is not more than 7, the compatibility of the compound (I) with a carboxy-containing linear copolymer used as a component (d) is lowered, and the photosensitive layer is easy to peel off from a board when it is laminated to the board. Also, when the sum of n and m is not less than 13, the hydrophilic property of the system is increased, and a resist image is easy to peel off at the time of development and also the solder plating resistance is lowered.

The addition-polymerizable compounds of the general formula (II) can be readily prepared as intermediates in the process proposed in Japanese Examined Patent Publication (Tokkyo Kokoku) No. 4929/1979. For instance, the compounds (II) are prepared from cyclic dibasic acid anhydrides of the general formula (A) by the following reaction scheme wherein Z, $R^5$, $R^6$ and $R^7$ are as defined above.

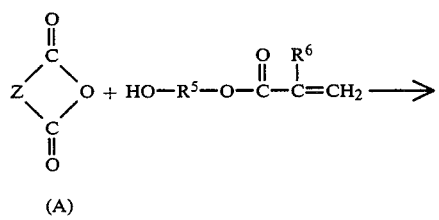

(A)

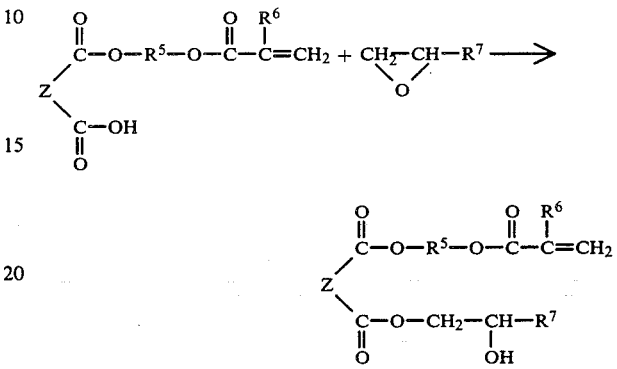

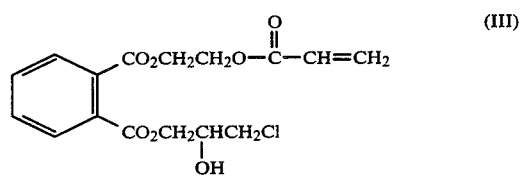

The cyclic dibasic acid anhydrides (A) include, for instance, succinic anhydride, phthalic anhydride, hexahydrophthalic anhydride, tetrahydrophthalic anhydride, 3,6-endomethylene-1,2,3,6,-tetrahydrophthalic anhydride (commercially available under the commercial name "Himic Anhydride" made by Hitachi Chemical Company, Ltd.), 3,6-endomethylene-1,2,3,6-tetrahydromethylphthalic anhydride (commercially available under the commercial name "Methylhimic Anhydride" made by Hitachi Chemical Company, Ltd.), and the like. Among the addition-polymerizable compounds represented by the general formula (II), $\beta'$-acryloyloxyethyl-$\gamma$-chloro-$\beta$-hydroxypropyl-ophthalate of the general formula (III):

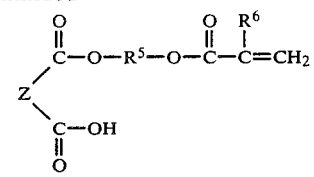

(III)

is particularly preferable.

Other addition-polymerizable compounds which are liquid and have at least one ethylenically unsaturated terminal group, may be optionally used in the invention with the addition-polymerizable compounds (I) and (II). Examples of the other addition-polymerizable compound are esters of polyhydric alcohols and $\alpha,\beta$-unsaturated carboxylic acids such as tetraethyleneglycol diacrylate and dimethacrylate, polyethyleneglycol diacrylate and dimethacrylate (number of ethylene groups: 2 to 14), trimethylolpropane diacrylate and dimethacrylate, trimethylolpropane triacrylate and trimethacrylate, tetramethylolmethane triacrylate and trimethacrylate, tetramethylolmethane tetraacrylate and tetraacrylate, polypropyleneglycol diacrylate and dimethacrylate (number of propylene groups: 2 to 14), dipentaerythritol pentaacrylate and pentamethacrylate, dipentaerythritol hexaacrylate and hexamethacrylate and addition-polymerizable compounds shown by the general formula (I) wherein n+m is 2 to 7, esters of glycidyl-containing compounds and α,β-unsaturated carboxylic acids such as trimethylolpropane triglycidyl ether triacrylate and bisphenol A diglycidyl ether diacrylate, and esters of polycarboxylic acids such as phthalic anhydride and ethylenically unsaturated compounds having hydroxyl group such as β-hydroxyethyl acrylate and methacrylate.

It is necessary that the photosensitive composition contains a photoactivatable polymerization initiator. As the photoactivatable polymerization initiator, there is preferably employed a photo-initiator or photo-initiator system which is not thermally activated at a temperature below 200° C. and is activated by an active light such as ultraviolet rays. Examples of the photoactivatable polymerization initiator are substituted or unsubstituted polynuclear quinones such as 2-ethylanthraquinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-chloroanthraquinone, 2-methylanthraquinone, 1,4-naphthaquinone, 9,10-phenanthraquinone, 2-methyl-1,4-naphthaquinone, 2,3-dichloronaphthaquinone, 1,4-dimethylanthraquinone, 2,3-dimethylanthraquinone, 3-chloro-2-methylanthraquinone and 7,8,9,10-tetrahydronaphthacenequinone, other aromatic ketones such as benzophenone, Michler's ketone [4,4'-bis(dimethylamino)benzophenone], 4,4'-bis(diethylamino)benzophenone and 4-methoxy-4'-dimethylaminobenzophenone, benzoin, benzoin ethers such as benzoin methyl ether, benzoin ethyl ether and benzoin phenyl ether, methylbenzoin, ethylbenzoin, and a combination of 2,4,5-triarylimidazole dimer with 2-mercaptobenzoxazole, a leuco crystaviolet or tris(4-diethylamino-2-methylphenyl)methane.

It is necessary that a linear copolymer having a carboxy content of 17 to 50% by mole, a water absorption of 4 to 30% by weight and a weight average molecular weight of 30,000 to 400,000 is present in a photosensitive layer formed from the composition of the present invention. An excellent resistance of a photoresist image to electroplating, a resistance to a pretreatment liquid for plating and other characteristics such as a close adhesion property to a board and the developing property are attained by the both of the addition-polymerizable compounds and the linear copolymer.

The linear copolymer is prepared by polymerizing two or more kinds of monomers. These monomers are divided into two large classes. The monomer of the first class is one to provide the linear copolymer with the developing property, and is a carboxylic acid having one unsaturated group or an acid anhydride. Examples of the monomer of the first class are acrylic acid, methacrylic acid, fumaric acid, cinnamic acid, crotonic acid, propiolic acid, itaconic acid, maleic acid, maleic anhydride, and maleic acid half ester. The monomer of the second class is selected so that the photoresist image retains the plating and etching resistances, the resistance to a developer, flexibility and plasticity. A compound having one unsaturated group is employed as a monomer of the second class. It is preferable to use a monomer such that the solubility of water in the monomer is not more than 2% by weight at 20° C. However, a small amount of a hydrophilic monomer such that the solubility of water in the monomer exceeds 2% by weight is usable, if the water absorption of the produced linear copolymer falls within the above range. The molecular weitht of the second monomer is desirable to be not more than 300, and the use of the second monomer having a molecular weight of more than 300 may impair the developing property. Examples of the monomer of the second class are alkyl acrylates and methacrylates such as methyl acrylate, methyl methacrylate, ethyl acrylate, ethyl methacrylate, butyl acrylate, butyl methacrylate, 2-ethylhexyl acrylate and 2-ethylhexyl methacrylate, esters of vinyl alcohol such as vinyl-n-butyl ether, and styrene and polymerizable styrene derivatives having a substituent at the α-position or the aromatic ring. Acrylic ring and methacrylic acid are preferred as a first monomer, and alkyl acrylates and alkyl methacrylates are preferred as a second monomer.

The first monomer and the second monomer are selected so that the produced linear copolymer has a carboxy content of 17 to 50% by mole and a water absorption of 4 to 30% by weight. The term "carboxy content" as used herein means a percentage (% by mole) of the number of moles of the first monomer based on the number of moles of the whole monomers used in the linear copolymer. The term "water absorption" as used herein means a value measured according to Japanese Industrial Standard (JIS) K 6911, that is to say, shows a rate of weight increase in immersion of a specimen having a diameter of 50±1 mm. and a thickness of 3±0.2 mm. in water at 23° C. for 24 hours.

The resistances of the linear copolymer to various treating liquids, including a plating liquid, is determined by the both of the carboxy content and the water absorption (hydrophilic property), but not by either one. Therefore, it is necessary that the carboxy content and the water absorption of the linear copolymer fall within the above-mentioned ranges. In case that the linear copolymer is specified merely by the carboxy content, if a very hydrophobic monomer is selected as a second monomer and thus the produced linear copolymer has a water absorption of less than 4% by weight, a photosensitive layer containing such a linear copolymer is hard to be developed, even if the carboxy content falls within the range of 17 to 50% by mole. On the other hand, even if the carboxy content is within the range of 17 to 50% by mole, when the water absorption of the linear copolymer exceeds 30% by weight, the development of the unexposed areas to light is very accelerated, but the hydrophilic property in the exposed areas exceeds the limit and the photoresist image is attacked with a developer most remarkably at its end portions, i.e. the boundary between the exposed and unexposed areas. This results in lowering of the resolving power and consequently lowering of the apparent sensitivity, and the resistances to plating and etching liquids are also lowered, thus causing phenomena such as peeling.

Also, the carboxy content of the linear copolymer is important as a factor of determining the developing property. When the water absorption is within the above range, but the carboxy content is less than 17% by mole, the development is impossible. On the other hand, when the carboxy content is more than 50% by mole, the gloss of the surface of a resist image disappears and the resistances are lowered, even if the water absorption falls within the above-mentioned range.

The molecular weight of the linear copolymer is connected with the film-forming property of a photosensitive composition, and also is a factor of secondarily determining the developing property and the resistances to treating liquids. The molecular weight of the linear copolymer is selected from 30,000 to 400,000, preferably 50,000 to 200,000, in the weight average molecular weight. When the weight average molecular weight of the linear copolymer is less than 300,000, the film-forming property is insufficient and also the resistances to treating liquids, including a develper, are lowered. When the weight average molecular weight is more than 400,000, the film-forming property and the resistances are very good, but the developing property is lowered.

In general, it is desirable to include a radical polymerization inhibitor in a photosensitive composition in order to prevent thermal polymerization during a heating operation and on storage. Examples of the polymerization inhibitor are p-methoxyphenol, hydroquinone, pyrogallol, naphthylamine, phenothiazine, pyridine, nitrobenzene, dinitrobenzene, p-toluquinone, chloranil and arylphosphites. Thermal polymerization inhibitors which are low volatile at a temperature below 200° C. are preferred, and such inhibitors include, for instance, alkyl-substituted hydroquinones, tert-butylcatechol, cuprous chloride, 2,6-di-tert-butyl-p-cresol, 2,2-methylene-bis(4-ethyl-6-tert-butylphenol) and 2,2-methylene-bis(2-methyl-6-tert-butylphenol).

Various coloring agents such as dyestuffs and pigments may be incorporated in a photosensitive composition. There are preferred coloring agents which have no effect on the characteristics of a photoresist and are not decomposed and vaporized at a temperature below 200° C. Examples of the coloring agent usable in the invention are, for instance, Fuchsine, Auramine bases, Alizarin Green, Para Rosaniline, Crystal Violet, Methyl Orange, Nile Blue 2B, Victoria Blue B, Malachite Green, Basic Blue 20, Iodine Green, Sudan Blue, Oil Green, New Magenta, Acid Violet RRH, Red Violet 5RS and New Methylene Blue GG.

Other additives such as a plasticizer and an adhesion accelerator may also be added to the photosensitive composition.

The addition-polymerizable compounds, photopolymerization initiator and linear copolymer are mixed so that the obtained photosensitive composition contains 30 to 60 parts by weight of the addition-polymerizable compounds, 0.5 to 10 parts by weight of the photopolymerization initiator, and 40 and 70 parts by weight of the linear copolymer. When the total amount of the addition-polymerizable compounds is less than 30 parts by weight, the obtained photosensitive layer is poor in flexibility and is easy to peel off from a board upon use, and also, when the total amount is more than 60 parts by weight, the photosensitive layer is softened and causes cold flow on storage of the rolled photosensitive element. It is preferable to employ the addition-polymerizable compound (I) in an amount of 25 to 35 parts by weight out of the total amount, i.e. 30 to 60 parts by weight, of the addition-polymerizable compounds used, because sufficient resistances to copper sulfate plating and solder plating are obtained and also the resolving power and the close adhesion property are improved. The addition-polymerizable compound (II) is employed preferably in an amount of 5 to 15 parts by weight, especially 7 to 13 parts by weight, out of the total amount, i.e. 30 to 60 parts by weight, of the addition-polymerizable compounds used, because the resolving power, particularly the close adhesion property of a resist image at the time of development and after development, the photosensitivity, the developing property and the plating resistance are improved. The addition-polymerizable compound other than the addition-polymerizable compounds (I) and (II) may be employed in an amount of 0 to 30 parts by weight out of the total amount, i.e. 30 to 60 parts by weight, of the addition-polymerizable compounds used. When the amount of the photopolymerization initiator is less than 0.5 part by weight, hardening of the photosensitive layer by active light radiation does not sufficiently proceed, thus resulting in formation of a photoresist having poor resistances. When the amount of the initiator is more than 10.0 parts by weight, the resolving power and the stability are lowered due to a high sensitivity of the photosensitive layer to an active light. When the amount of the linear copolymer is less than 40 parts by weight, the photosensitive layer is softened and causes cold flow on storage, and when the amount is more than 70 parts by weight, the photosensitive layer becomes fragile and is easy to peel off upon use.

The photosensitive composition of the present invention is usually employed in the form of a solution. The components (a), (b) and (c) of the composition are uniformly dissolved in a solvent. Any solvents which can dissolve the components are usable as the solvent, and for instance, there are mentioned common organic solvents such as acetone, methyl ethyl ketone, methyl isobutyl ketone, methyl cellosolve, ethyl cellosolve, dichloromethane, chloroform, methyl alcohol and ethyl alcohol. The solvents may be employed alone or in admixture thereof.

A polymer film is usually employed as a support film and a protective cover film for the photosensitive layer of a photosensitive element. Examples of the polymer film are, for instance, polyethylene terephthalate, polypropylene and polyethylene films, and a polyethylene terephthalate film is preferred. These films must be removable from the photosensitive layer and, therefore, a film which cannot be removed or has a treated surface is not usable. The thickness of the polymer film is selected from 5 to 100 μm., preferably 10 to 30 μm. The photosensitive layer may be sandwiched by two sheets of such polymer films, one of which is employed as a support and the other is a cover.

A photosensitive element is prepared in a usual manner by employing the photosensitive composition of the present invention. A photosensitive layer is formed usually by uniformly coating the composition in the form of solution of a polymer film support and drying the coated composition by means of heating and/or blowing of a hot air to give a dried coating as a photosensitive layer. The thickness of the photosensitive layer is not particularly limited, and a usual thickness is adoptable. In general, the thickness of the photosensitive layer is selected from 10 to 100 μm., preferably 20 to 60 μm. A protective film cover may be further superposed on the photosensitive layer. The thus prepared photosensitive element consisting of the support and the photosensitive layer or of the support, the photosensitive layer and the protective cover is rolled and stored.

The photosensitive element of the present invention has an excellent adhesive property, and is advantageously employed for the preparation of a photoresist image. The photosensitive element is laminated onto a board under pressure with heating so as to cause the photosensitive layer to stick to the board. When the photosensitive element has a protective cover, the cover is removed before the lamination. The surface to be laminated with the photosensitive layer is preferably a metal surface, but not limited thereto particularly. The necessity for heating a board depends on the laminating temperature at which the photosensitive layer is heated.

When the photosensitive element is employed at a high laminating temperature, it is possible to omit the heating of the board. Of course, the board may be heated to further increase the adhesive property.

When the photosensitive element of the invention is laminated at a laminating temperature of a conventional photosensitive element, i.e. at a temperature of 90° to 130° C., the amounts of ingredients evaporated and scattered are very slight as compared with a conventional photosensitive element. Also, the photosensitive element of the invention is usuable at a higher laminating temperature, i.e. at a temperature of 160° to 180° C. to which a conventional photosensitive element is not endurable, and even at such a high temperature the amounts of ingredients evaporated and scattered are slight and moreover the characteristics of the photosensitive layer are not impaired.

After the completion of the lamination, the photosensitive layer is exposed imagewise to an active light through a negative or positive film. When the film support present on the photosensitive layer is transparent, the exposure to light is conducted either before or after removing the support, and when the support is opaque, the exposure is conducted after removing the support. From the viewpoint of protection of the photosensitive layer, it is desirable that the support is a transparent film and the photosensitive layer with the transparent support is exposed to light through the transparent support. As an active light, there is employed a light from a known source of active light such as a carbon arc lamp, a mercury arc lamp or a xenon arc lamp. The sensitivity of the photoactivatable polymerization initiator contained in the photosensitive layer is usually maximum in the ultraviolet ray region, and in that case, a light source capable of effectively radiating ultraviolet rays is selected. In case that the initiator is one sensitive to visible rays, e.g. 9,10-phenanthrenequinone, visible rays are of course employed as an active light. As sources of visible rays, a floodlight for photograph and a sun lamp are usable as well as the above-mentioned light sources.

After exposing the photosensitive layer to light, and after removing the film support if it is present on the photosensitive layer, development is conducted by removing the unexposed areas with an aqueous alkali solution as a developer in a known manner such as spraying, immersion with vibrating, brushing or scraping. Examples of the base employed in the developer are alkali hydroxides, e.g. hydroxides of alkali metals such as lithium, sodium and potassium, alkali carbonates, e.g. carbonates and bicarbonates of alkali metals such as lithium, sodium and potassium, alkali metal phosphates such as potassium and sodium phosphates, and alkali metal pyrophosphates such as potassium and sodium pyrophosphates. An aqueous solution of sodium carbonate is particularly preferred as a developer. The pH of an 1 to 3% by weight aqueous alkali solution is preferably from 9 to 11. The temperature of the aqueous alkali solution may be adjusted according to the developing property of the photosensitive layer. The aqueous alkali solution may contain a surface active agent, an antifoaming agent and a small amount of an organic solvent for accelerating the development.

In case of the preparation of printed circuit boards, the exposed surfaces of a board is then treated with an etching or plating liquid in a known manner by employing the developed photoresist image as a mask. The photoresist image is then peeled off usually by employing an aqueous solution having a stronger alkalinity than that of an aqueous alkali solution used as a developer. For instance, a 2 to 10% by weight aqueous solution of sodium hydroxide is employed as an aqueous strong alkaline solution for removing the photoresist image. However, the manner of peeling off the photoresist image is not particularly limited to the above-mentioned manner.

The present invention is more specifically described and explained by means of the following examples, in which all % are by weight unless otherwise noted. It is to be understood that the present invention is not limited to the Examples and various changes and modifications may be made in the invention without departing from the spirit and scope thereof.

EXAMPLE 1 AND COMPARATIVE EXAMPLE 1

A solution A of the following formulation as uniformly coated on a polyethylene terephthalate film having a thickness of 25 μm. and was dried at 100° C. for about 3 minutes in a convection type hot air drier to form a photosensitive layer having a thickness of about 25 μm. A polyethylene film was then laminated as a protective film onto the photosensitive layer to give a photosensitive element FA of the present invention (Example 1).

| Solution A | | |
|---|---|---|
| Copolymer of 60% of methyl methacrylate, 20% of methacrylic acid and 20% of 2-ethylhexyl acrylate (carboxy content: 23% by mole, water absorption: 7%, weight average molecular weight: about 80,000) | 52 | g. |
| Addition-polymerizable compound of the general formula (IV) (commercial name "BPE-10" made by Shin Nakamura Kogyo Kabushiki Kaisha) wherein n + m = 10 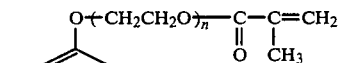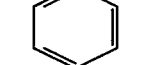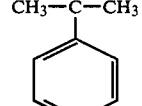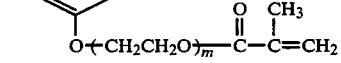 (IV) | 30 | g. |
| 2-Hydroxy-3-chloropropyl-2'-acryloyloxyethyl-o-phthalate | 5 | g. |
| 2-Ethylanthraquinone | 2.5 | g. |
| 2,2'-Methylene-bis(4-ethyl-6-tert-butylphenol) | 0.6 | g. |
| Victoria Pure Blue | 0.09 | g. |
| Ethyl cellosolve | 130 | g. |
| Methyl ethyl ketone | 10 | g. |
| Chloroform | 10 | g. |

For comparison, a photosensitive element FA' was prepared in the same manner as above except that a solution A' of the following formulation containing a different addition-polymerizable compound was employed (Comparative Example 1).

| Solution A' | |
|---|---|
| Copolymer of 60% of methyl methacrylate, 20% of methacrylic acid and 20% of 2-ethylhexyl acrylate (carboxy content: | 52 g |

| Solution A' | |
|---|---|
| 23% by mole, water absorption: 7%, weight average molecular weight: about 80,000) | |
| Tetraethylene glycol diacrylate (commercial name "A-4G" made by Shin Nakamura Kagaku Kogyo Kabushiki Kaisha) | 35 g. |
| 2-Ethylanthraquinone | 2.5 g. |
| 2,2'-Methylene-bis(4-ethyl-6-tert-butylphenol) | 0.6 g. |
| Victoria Pure Blue | 0 09 g. |
| Ethyl cellosolve | 130 g. |
| Methyl ethyl ketone | 10 g. |
| Chloroform | 10 g. |

The copper surface of a glass fiber-epoxy material having copper foils on the both surfaces (copper clad epoxy-fiber glass board commercially available under commercial name "MCL-E-61" made by Hitachi Chemical Company, Ltd.) was scoured with a #800 sand paper, washed with water and dried in air stream. The board was heated to 60° C., and after removing the polyethylene film cover, the photosensitive layer was laminated onto the copper surface with heating the photosensitive element FA or FA' at 160° C. The both elements FA and FA' had a good adhesive property to the board.

The obtained two sensitized copper clad boards were exposed for 10 seconds to a 3 kW high-pressure mercury lamp (commercial name "Phenix-3000" made by Kabushiki Kaisha Ohku Seisakusho) at a distance of 50 cm. through a negative film. The polyethylene terephthalate support film was peeled off, and the development was carried out by spraying a 2% aqueous solution of sodium carbonate at 30° C. to remove the unexposed areas of the photosensitive layer. The development of the both boards was attained in about 45 seconds, and the both boards showed a good developing property.

The photoresist images obtained from the both photosensitive elements FA and FA' had a good resolving power such that two adjacent lines of which distance was 80 μm. could be definitely distinguished. The photoresist images also had sufficient resistances to usual etching liquids such as an aqueous solution of ferric chloride, an aqueous solution of cupric chloride and an aqueous solution of ammonium persulfate.

The boards having the photoresist images obtained from the photosensitive elements FA and FA' were subjected to the plating treatment shown in Table 1. The photoresist image obtained from the element FA had a sufficient resistance, but the photoresist image obtained from the element FA' was poor in resistance and peeling off of the resist film occurred after the solder plating.

TABLE 1

| Step | Condition |
|---|---|
| (1) Defatting | defatting agent (commercially available under the registered trademark "Neutraclean 68" made by Shipley Far East Kabushiki Kaisha): 67%; ordinary temp.; immersion for 2 min. |
| (2) Water washing | ordinary temp.; 60 sec.; 3 times |
| (3) Soft etching | aqueous solution of ammonium persulfate; 250 g./liter; ordinary temp.; 90 sec. |
| (4) Water washing | ordinary temp.; 60 sec. |
| (5) Immersion in sulfuric acid | 20% sulfuric acid; ordinary temp.; 60 sec. |
| (6) Copper sulfate plating | composition of plating liquid; 75 g./liter of copper sulfate, 190 g./liter of 98% sulfuric acid, 0.12 ml./liter of 36% hydrochloric acid of reagent grade. 5 ml./liter of Glossing agent (commercially available under the registered trademark "Copper Gream" made by Japan Ronal, Inc.) and the residual amount of water (total: 1 liter); current density: 2.0 A/dm$^2$.; ordinary temp.; 60 min. |
| (7) Water washing | ordinary temp.; 60 sec.; 3 times |
| (8) Immersion in sulfuric acid | 20% sulfuric acid: ordinary temp.; 60 sec. |
| (9) Water washing | ordinary temp.; 60 sec. |
| (10) Immersion in borofluoric acid | 20% borofluoric acid; ordinary temp.; 60 sec. |
| (11) Solder plating | composition of plating liquid: 25 g./liter of boric acid, 400 g./liter of borofluoric acid, 11.5 g./liter of lead borofluoride, 23.1 g./liter of tin borofluoride, 5 g./liter of peptone and the residual amount of water (total: 1 liter); current density: 1.5 A/dm$^2$.; ordinary temp,; 18 min. |
| (12) Water washing | ordinary temp.; 60 sec.; 3 times |

EXAMPLE 2 AND COMPARATIVE EXAMPLE 2

A photosensitive element FB having a photosensitive layer of about 25 μm. in thickness (Example 2) and a photosensitive element FB' having a photosensitive layer of about 25 μm. in thickness (Comparative Example 2) were prepared from solutions B and B' of the following formulations in the same manner as in Example 1.

| Solution B | |
|---|---|
| Copolymer of 25% of methacrylic acid, 45% of methyl methacrylate and 30% of ethyl acrylate (carboxy content: 28% by mole, water absorption: 27%, weight average molecular weight: about 90,000) | 52 g. |
| Addition-polymerizable compound (IV) | 30 g. |
| β-Methacryloyloxyethyl-β'-hydroxypropyl-o-phthalate | 5 g. |
| Benzophenone | 2.5 g. |
| 4,4'-Bis (diethylamino) benzophenone | 0.6 g. |
| Victoria Pure Blue | 0.14 g. |
| Ethyl cellosolve | 130 g. |
| Methyl ethyl ketone | 10 g. |
| Chloroform | 10 g. |

| Solution B' | |
|---|---|
| Copolymer of 25% of methacrylic acid, 45% of methyl methacrylate and 30% of ethyl acrylate (carboxy content: 28% by mole, water absorption: 27%, weight average molecular weight: about 80,000 to about 100,000) | 52 g. |
| 2,2'-Bis (4-methacryloyloxydiethoxyphenyl)-propane (commercial name "BPE-4" made by Shine Nakamura Kagaku Kabushiki Kaisha) | 35 g. |
| Benzophenone | 2.5 g. |
| 2,2'-Bis (diethylamino) benzophenone | 0.6 g. |
| Victoria Pure Blue | 0.14 g. |
| Ethyl cellosolve | 130 g. |
| Methyl ethyl ketone | 10 g. |
| Chloroform | 10 g. |

The lamination of the obtained photosensitive elements FB and FB', the exposure and the development were conducted in the same manner as in Example 1. The element FB had a good adhesive property to the board, but the element FB' was easily peeled off. Also, the resist image formed from the element FB had sufficient resistances to the etching liquids such as an aqueous solution of ferric chloride, an aqueous solution of cupric chloride and an aqueous solution of ammonium persulfate, but the resist image formed from the element FB' partially peeled off during etching and was poor in the etching resistance.

The plating resistance of the resist images were also estimated in the plating treatment carried out in the same manner as in Example 1. The resist image formed from the photosensitive element FB had a sufficient resistance, but the resist image formed from the photosensitive element FB' had no resistance because most of the formed resist image peeled off.

EXAMPLE 3 AND COMPARATIVE EXAMPLE 3

A photosensitive element FC (Example 3) and a photosensitive element FC' (Comparative Example 3) were prepared in the same manner as in Example 1, respectively, from a solution C and a solution C' in which there was employed a linear copolymer having a carboxy content lower than the range of the present invention. The thickness of each of the photosensitive layers of the elements FC of FC' was from 23 to 26 μm.

| Solution C | |
|---|---|
| Copolymer of 25% of methacrylic acid, 53% of methyl methacrylate and 22% of butyl acrylate (carboxy content: 32% by mole, water absorption: 6%, weight average molecular weight: 90,000) | 52 g. |
| Addition-polymerizable compound (IV) | 30 g. |
| 2-Hydroxy-3-chloropropyl-2'-acryloyloxyethyl-o-phthalate | 6 g. |
| Benzophenone | 2.5 g. |
| 4,4'-Bis (diethylamino) benzophenone | 0.6 g. |
| Victoria Pure Blue | 0.14 g. |
| Ethyl cellosolve | 130 g. |
| Methyl ethyl ketone | 10 g. |
| Chloroform | 10 g. |

| Solution C' | |
|---|---|
| Copolymer of 13% of methacrylic acid, 62% of methyl methacrylate and 25% of ethyl acrylate (carboxy content: 15% by mole, water absorption: 8%, weight average molecular weight: 90,000) | 52 g. |
| Addition-polymerizable compound (IV) | 30 g. |
| 2-Hydroxy-3-chloropropyl-2'-acryloyloxyethyl-o-phthalate | 6 g. |
| Benzophenone | 2.5 g. |
| 4,4'-Bis (diethylamino) benzophenone | 0.6 g. |
| Victoria Pure Blue | 0.14 g. |
| Ethyl cellosolve | 130 g. |
| Methyl ethyl ketone | 10 g. |
| Chloroform | 10 g. |

The lamination and exposure to light of the obtained photosensitive elements FC and FC' were carried out in the same manner as in Example 1. The adhesion properties of the elements FC and FC' to the board were similar. After removing the polyethylene terephthalate support film, the development was carried out by spraying a 2% aqueous solution of sodium carbonate at 30° C. to the photosensitive layer. The photosensitive layer obtained from the solution C was developed in about 40 seconds and showed a good developing property, but the photosensitive layer obtained from the solution C' was not developed even by the spraying for 180 seconds, and the developing property thereof was bad. The etching and plating resistances were evaluated in the same manner as in Example 1. The board with the resist image fromed from the element FC had sufficient etching and plating resistances.

EXAMPLE 4 AND COMPARATIVE EXAMPLE 4

Photosensitive elements FD and FD' were prepared in the same manner as in Example 1 by employing the following solution D formulated according to the present invention and the following solution D' showing a Comparative Example which was different from the solution D in addition-polymerizable compound. The thickness of the photosensitive layers was within the range of 23 to 26 μm.

| Solution D | |
|---|---|
| Copolymer of 25% of methacrylic acid, 37% of methyl methacrylate, 8% of 2-ethylhexyl acrylate and 30% of butyl methacrylate (carboxy content: 22% by mole, water absorption: 6%, weight average molecular weight: 90,000) | 52 g. |
| Addition-polymerizable compound (IV) | 30 g. |
| 2-Hydroxy-3-chloropropyl-2'-methacryloyloxyethyl-o-phthalate | 8 g. |
| Benzophenone | 2.5 g. |
| 4,4'-Bis (diethylamino) benzophenone | 0.6 g. |
| Victoria Pure Blue | 0.14 g. |
| Ethyl cellosolve | 130 g. |
| Methyl ethyl ketone | 10 g. |
| Chloroform | 10 g. |

| Solution D' | |
|---|---|
| Copolymer of 25% of methacrylic acid, 37% of methyl methacrylate, 8% of 2-ethylhexyl methacrylate and 30% of butyl methacrylate carboxy content: 22% by mole, water absorptiona: 6%, weight average molecular weight: 90,000) | 52 g. |
| XIV ethylene glycol diacrylate (commercial name "A-14G" made by Shin Nakamura Kagaku Kogyo Kabushiki Kaisha) | 13 g. |
| 2,2'-Bis(4-methacryloyloxydiethoxyphenyl)-propana (commercial name "BPE-4" made by Shine Nakamura Kagaku Kogyo Kabushiki Kaisha) | 10 g. |
| Dipentaerythritol hexaacrylate (commerical name "DPHA" made by Nippon Kayaku Co., Ltd.) | 15 g. |
| Benzophenone | 2.5 g. |
| 4,4'-Bis(diethylamino)benzophenone | 0.6 g. |
| Victoria Pure Blue | 0.14 g. |
| Ethyl cellosolve | 130 g. |
| Methyl ethyl ketone | 10 g. |
| Chloroform | 10 g. |

The lamination, exposure to light and development of the photosensitive layers obtained from the solutions D and D' were carried out in the same manner as in Example 1. With respect to the adhesion property to the board, developing property and resolving power, the photosensitive elements FD and FD' showed approximately the same results. The both elements also had a sufficient resistance to etching liquids.

The plating resistance of the resist images obtained from the elements FD and FD' were evaluated in the same manner as in Example 1. In the plating treatment shown in Table 1, the photoresist image obtained from the element FD showed a sufficient resistance, but the photoresist image obtained from the element FD' was poor in the plating resistance and peeling off of the resist image occurred after solder plating. The resistance to a solder plating liquid having a low concentration of borofluoric acid, namely the solder plating liquid shown in Table 2, was tested. The resist image obtained from the element FD' had a sufficient resistance to this solder plating liquid. From these results, it is understood that the photoresist image obtained from the photosensitive element containing the addition-polymerizable compounds of the invention has a resistance even to a solder plating liquid having a very high concentration of borofluoric acid as compared with the photoresist image of the comparative example.

TABLE 2

(Composition of solder plating liquid having low concentration of borofluoric acid)

| | |
|---|---|
| Borofluoric acid | 100 g./liter |
| Lead borofluoride | 18 g./liter |
| Tin borofluoride | 99 g./liter |
| Unicon Tinbright No. 1* | 40 g./liter |
| Unicon Tinbright No. 2** | 60 ml./liter |
| Formalin | 10 ml./liter |
| Pure water | residue |
| Total | 1 liter |

(Note)*, ** Glossing agent, registered trademark of Ishihara Yakuhin Kabushiki Kisha As explained in detail in the examples, the photosensitive element obtained from the photosensitive composition of the present invention has an excellent resistance to plating as well as other characteristics such as adhesion property to boards and developing property.

In addition to the ingredients used in the examples, other ingredients can be used in the examples as set forth in the specification to obtain substantially the same results.

What we claim is:

1. A photosensitive composition, developable by aqueous alkali solution, consisting essentially of:

30 to 60 parts by weight of (a) an addition-polymerizable compound of the general formula (I):

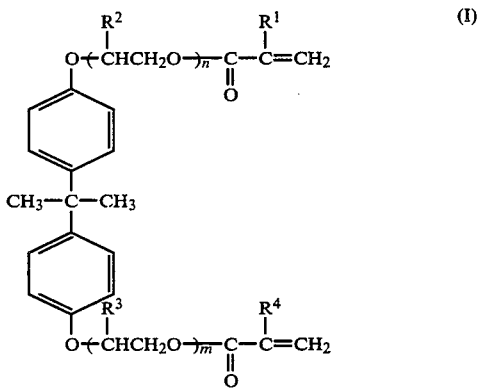

wherein $R^1$, $R^2$, $R^3$ and $R^4$ are the same or different and each is hydrogen atom or methyl group, and n and m are a positive integer, provided than $n+m=8$ to 12, and (b) 5 to 15 parts by weight of an addition-polymerizable compound of the general formula (II):

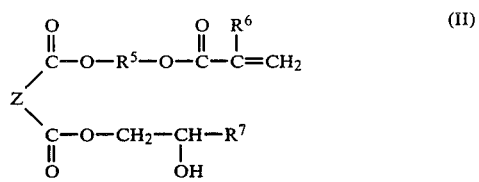

wherein Z is a cyclic dibasic acid residue, $R^5$ is an alkyl group having 1 to 3 carbon atoms, $R^6$ is hydrogen atom or methyl group, and $R^7$ is hydrogen atom, methyl group, ethyl group or $CH_2X$ in which X is chlorine atom or bromine atom, 0.5 to 10.0 parts by weight of (c) a photoactivatable polymerization initiator, and 40 to 70 parts by weight of (d) a linear copolymer having a carboxy content of 17 to 50% by mole, a water absorption of 4 to 30% by weight and a weight average molecular weight of 30,000 to 400,000.

2. The composition of claim 1, which consists essentially of 25 to 35 parts by weight of the component (a), 5 to 15 parts by weight of the component (b), 0.5 to 10.0 parts by weight of the component (c) and 40 to 70 parts by weight of the component (d).

3. A photosensitive composition which contains the composition of claim 1 admixed with a radical polymerization inhibitor and a coloring agent.

4. A photosensitive element, developable by aqueous alkali solution, comprising a photosensitive layer supported on a polymer film, said photosensitive layer having a composition according to claim 1.

5. The composition of claim 1, wherein said compound (a) has the formula:

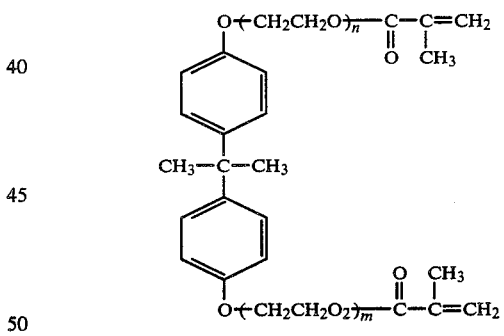

and compound (b) is 2-hydroxy-3-chloropropyl-2'-acryloyloxyethyl-o-phthalate, initiator (c) is 2-ethylanthraquinone and the linear copolymer (d) is a copolymer of 60% of methyl methacrylate, 20% of methyacrylic acid and 20% of 2-ethylhexylacrylate.

6. The composition of claim 1, wherein said photoactivatable polymerization initiator (c) is selected from the group consisting of 2-ethylanthraquinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-chloroanthraquinone, 2-methylanthraquinone, 1,4-naphthaquinone, 9,10-phenanthraquinone, 2-methyl-1,4-naphthaquinone, 2,3-dichloronaphthaquinone, 1,4-dimethylanthraquinone, 2,3-dimethylanthraquinone, 3-chloro-2-methylanthraquinone and 7,8,9,10-tetrahydronaphthacenequinone, benzophenone; 4,4'-bis(dimethylamino)benzophenone, 4,4'-bis(-diethylamino)benzophenone, 4-methoxy-4'-dimethylaminobenzophenone, benzoin, benzoin methyl ether, benzoin ethyl ether and benzoin phenyl ether, methylbenzoin, ethylbenzoin and acombination of 2,4,5-triarylimidazole dimer with 2-mercaptobenzoxazole, a leuco crystalviolet or tris(4-diethylamino-2-methylphenyl)methane.

7. The composition of claim 1, wherein the linear copolymer (d) is prepared by reacting at least one monomer selected from the group consisting of acrylic acid, methacrylic acid, fumaric acid, cinnamic acid, crotonic acid, propiolic acid, itaconic acid, maleic acid, maleic anhydride, and maleic acid half ester with at least one monomer selected from the group consisting of methyl acrylate, methyl methacrylate, ethyl acrylate, ethyl methacrylate, butyl acrylate, butyl methacrylate, 2-ethylhexyl acrylate, 2-ethylhexyl methacrylate, vinyl-n-butyl ether, styrene and a polymerizable substituted styrene monomer.

8. A photosensitive element, developable by aqueous alkali solution, comprising a photosensitive layer supported on a polymer film, said photosensitive layer consists essentially of:

30 to 60 parts by weight of (a) an addition-polymerizable compound of the general formula (I):

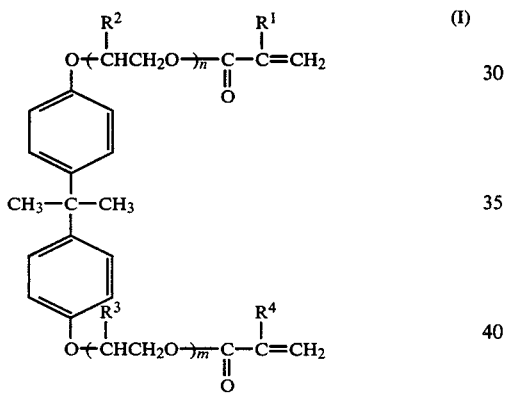

wherein $R^1$, $R^2$, $R^3$ and $R^4$ are the same or different and each is hydrogen atom or methyl group, and n and m are a positive integer, provided that $n+m=8$ to 12, and (b) 5 to 15 parts by weight of an addition-polymerizable compound of the general formula (II):

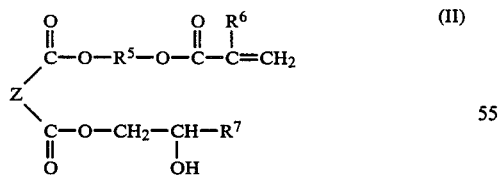

wherein Z is a cyclic dibasic acid residue, $R^5$ is an alkyl group having 1 to 3 carbon atoms, $R^6$ is hydrogen atom or methyl group, and $R^7$ is hydrogen atom, methyl group, ethyl group or $CH_2$ X in which X is chlorine atom or bromine atom, 0.5 to 10.0 parts by weight of (c) a photoactivatable polymerization initiator, and 40 to 70 parts by weight of (d) a linear copolymer having a carboxy content of 17 to 50% by mole, a water absorption of 4 to 30% by weight and a weight average molecular weight of 30,000 to 400,000.

9. The element of claim 8, wherein said photosensitive layer consists essentially of 25 to 35 parts by weight of the component (a), 5 to 15 parts by weight of the component (b), 0.5 to 10.0 parts by weight of the component (c) and 40 to 70 parts by weight of the component (d).

10. A photosensitive composition consisting essentially of:

25 to 35 parts by weight of (a) an addition-polymerizable compound of the general formula (I):

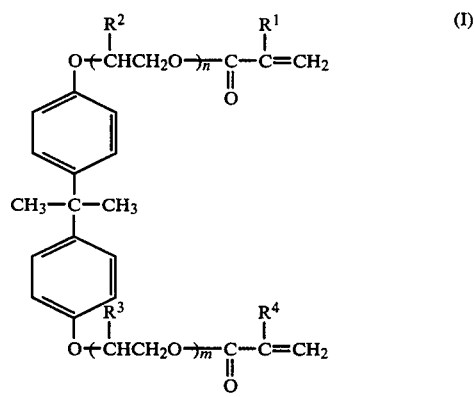

wherein $R^1$, $R^2$, $R^3$ and $R^4$ are the same or different and each is hydrogen atom or methyl group, and n and m are a positive integer, provided that $n+m=8$ to 12, 5 to 15 parts by weight of (b) an addition-polymerizable compound of the general formula (II):

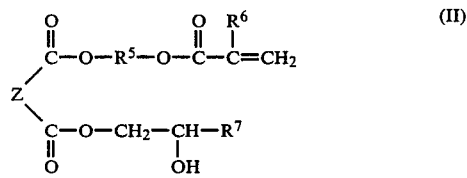

wherein Z is a cyclic dibasic acid residue, $R^5$ is an alkyl group having 1 to 3 carbon atoms, $R^6$ is hydrogen atom or methyl group, and $R^7$ is hydrogen atom, methyl group, ethyl group or $CH_2X$ in which X is chlorine atom or bromine atom, 0.5 to 10.0 parts by weight of (c) a photoactivatable polymerization activator, 40 to 70 parts by weight of (d) a linear copolymer having a carboxy content of 17 to 50% by mole, a water absorption of 4 to 30% by weight and a weight average molecular weight of 30,000 to 400,000, and 0 to 30 parts by weight of (e) an addition-polymerizable compound other than the compounds (a) and (b); the total amount of the compounds (a) and (b) and said other addition-polymerizable compound (e) being from 30 to 60 parts by weight, and said other addition-polymerizable compound (e) being selected from the group consisting of esters of polyhydric alcohols and $\alpha,\beta$-unsaturated carboxylic acids, compounds of the following general formula:

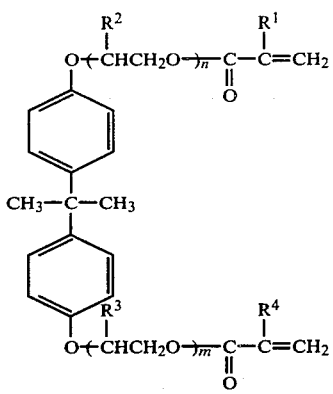

wherein $R^1$, $R^2$, $R^3$ and $R^4$ are the same or different and each is hydrogen atom or methyl group, and n and m are a positive integer, provided that $n+m=2$ to 7, esters of glycidyl-containing compounds and $\alpha,\beta$-unsaturated carboxylic acids, and esters of polycarboxylic acids and ethylenically unsaturated compounds having hydroxyl group.

11. A photosensitive element, developable by aqueous alkali solution, comprising a photosensitive layer supported on a polymer film, said photosensitive layer consisting essentially of:

25 to 35 parts by weight of (a) an addition-polymerizable compound of the general formula (I):

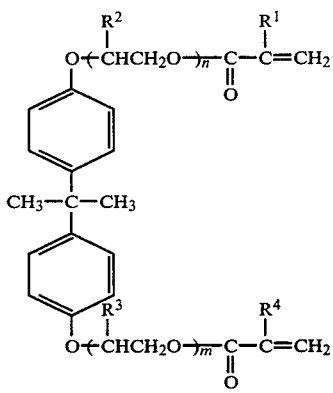

wherein $R^1$, $R^2$, $R^3$ and $R^4$ are the same or different and each is hydrogen atom or methyl group, and n and m are positive integer, provided that $n+m=8$ to 12, 5 to 15 parts by weight of (b) an addition-polymerizable compound of the general formula (II):

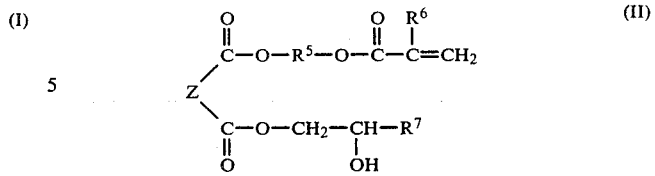

wherein Z is a cyclic dibasic acid residue, $R^5$ is an alkyl group having 1 to 3 carbon atoms, $R^6$ is hydrogen atom or methyl group, and $R^7$ is hydrogen atom, methyl group, ethyl group or $CH_2X$ in which X is chlorine atom or bromine atom, 0.5 to 10.0 parts by weight of (c) a photoactivatable polymerization initiator, 40 to 70 parts by weight of (d) a linear copolymer having a carboxy content of 17 to 50% by mole, a water absorption of 4 to 30% by weight and a weight average molecular weight of 30,000 to 400,000, and 0 to 30 parts by weight of (e) an addition-polymerizable compound other than the compounds (a) and (b); the total amount of the compounds (a) and (b) and said other addition-polymerizable compound (e) being from 30 to 60 parts by weight, and said other addition-polymerizable compound (e) being selected from the group consisting of esters of polyhydric alcohols and $\alpha,\beta$-unsaturated carboxylic acids, compounds of the following general formula:

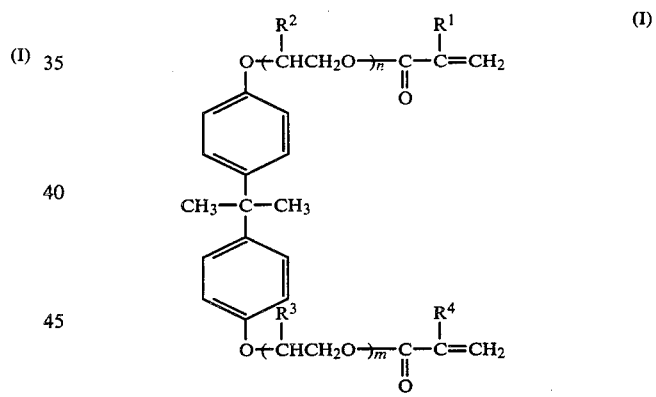

wherein $R^1$, $R^2$, $R^3$ and $R^4$ are the same or different and each is hydrogen atom or methyl group, and n and m are a positive integer, provided that $n+m=2$ to 7, esters of glycidyl-containing compounds and $\alpha,\beta$-unsaturated carboxylic acids, and esters of polycarboxylic acids and ethylenically unsaturated compounds having hydroxyl group.

* * * * *